US008830111B2

(12) United States Patent
Koscielnik et al.

(10) Patent No.: US 8,830,111 B2
(45) **Date of Patent: *Sep. 9, 2014**

(54) METHOD AND APPARATUS FOR CLOCKLESS CONVERSION OF TIME INTERVAL TO DIGITAL WORD

(71) Applicants: Dariusz Koscielnik, Cracow (PL); Marek Miskowicz, Cracow (PL)

(72) Inventors: Dariusz Koscielnik, Cracow (PL); Marek Miskowicz, Cracow (PL)

(73) Assignee: Akademia Gorniczo-Hutnicza IM. Stanislawa Staszica, Cracow (PL)

( * ) Notice: Subject to any disclaimer, the term of this patent is extended or adjusted under 35 U.S.C. 154(b) by 0 days.

This patent is subject to a terminal disclaimer.

(21) Appl. No.: 13/755,390

(22) Filed: Jan. 31, 2013

(65) Prior Publication Data

US 2013/0207826 A1 Aug. 15, 2013

(30) Foreign Application Priority Data

Jan. 31, 2012 (PL) ........................................ 397957
Jan. 31, 2012 (PL) ........................................ 397959

(51) Int. Cl.
*H03M 1/12* (2006.01)
*G04F 10/00* (2006.01)

(52) U.S. Cl.
CPC .................................... *G04F 10/005* (2013.01)
USPC ........................................... 341/172; 341/155

(58) Field of Classification Search
CPC .................................................... G04F 10/105
USPC ................................................. 341/172, 155
See application file for complete search history.

(56) References Cited

U.S. PATENT DOCUMENTS

| | | | | |
|---|---|---|---|---|
| 4,831,381 | A * | 5/1989 | Hester | 341/172 |
| 5,012,247 | A * | 4/1991 | Dillman | 341/172 |
| 7,528,761 | B2 * | 5/2009 | Draxelmayr | 341/172 |
| 7,903,018 | B2 * | 3/2011 | Schatzberger et al. | 341/172 |
| 7,944,379 | B2 * | 5/2011 | Ohnhaeuser et al. | 341/118 |
| 2009/0115507 | A1 * | 5/2009 | Cho | 330/9 |

* cited by examiner

*Primary Examiner* — Jean B Jeanglaude
(74) *Attorney, Agent, or Firm* — Ladas & Parry LLP

(57) ABSTRACT

Method and apparatus for detecting the beginning and end of a time interval using the control module and in mapping this time interval to a portion of electric charge proportional to this time interval and accumulated in the sampling capacitor and then realizing the process of charge redistribution in the array of redistribution by changing states of signals from relevant control outputs and in assignment of relevant values to bits in the digital word by means of the control module. After detection of the beginning of the next time interval, the charge is accumulated in the additional sampling capacitor and then the process of charge redistribution is realized and relevant values are assigned to bits of the digital word. When the beginning of the subsequent time interval is detected, the next cycle begins and electric charge is accumulated in the sampling capacitor again.

8 Claims, 10 Drawing Sheets

METHOD AND APPARATUS FOR CLOCKLESS CONVERSION OF TIME INTERVAL TO DIGITAL WORD

This application claims priority to Polish patent application number P 397 957, filed Jan. 31, 2012, and Polish patent application number P 397 959, filed Jan. 31, 2012, the contents of which are incorporated herein by reference.

The subject of this invention is a method and an apparatus for clockless conversion of a time interval to a digital word that that can be applied in monitoring and control systems.

The method for the anachronous conversion of a voltage value to a digital word known from the Polish patent application P-392925 (PCT/PL2011/050021, published as WO 2011/152744) consists in mapping a converted time interval to a portion of electric charge proportional to this time interval. A given portion of charge is delivered by the use of the current source during the converted time interval and is accumulated in the sampling capacitor. Accumulation of electric charge is realized until the end of the time interval is detected. Then, the accumulated electric charge is submitted to the process of redistribution by deploying the charge in the array of capacitors while a capacitance value of each capacitor of a given index is twice as high as a capacitance value of a capacitor of the previous index. During the process of redistribution, the accumulated electric charge is deployed in the capacitors in the array in a way that the obtained voltage equals zero, or equals the reference voltage on each capacitor or on each capacitor with the possible exception of one of capacitors. The course of the process of redistribution is controlled by means of the control module on the basis of output signals of the first and of the second comparator. Electric charge is delivered during the process of its accumulation by the use of the first current source and is transferred between capacitors during the process of its redistribution by the use of the second current source. By means of the control module, the value one is assigned to these bits in the digital word that correspond to capacitors on which voltage equal to the reference voltage value has been obtained and the value zero is assigned to the other bits in the digital word.

In one of variants of this solution, electric charge is accumulated simultaneously in the sampling capacitor and in the capacitor of the highest capacitance value in the array of capacitors which is connected to the sampling capacitor in parallel.

The apparatus for the asynchronous conversion of a time interval to a digital word is also known from the Polish patent application P-392925 (PCT/PL2011/050021). This apparatus comprises the array of capacitors whose control inputs are connected to the set of control outputs of the control module. The control module is equipped with the digital output, the complete conversion signal output, the time interval signal input and two control inputs. The first control input of the control module is connected to the output of the first comparator whose inputs are connected to one pair of outputs of the array of capacitors. The other control input of the control module is connected to the output of the second comparator whose inputs are connected to the other pair of outputs of the array. Furthermore, the voltage supply, the source of auxiliary voltage together with the source of the reference voltage, the sampling capacitor and two controlled current sources whose control inputs are connected to the relevant control outputs of the control module. The array of capacitors comprises on-off switches, change-over switches and the array of capacitors whose number equals the number of bits in the digital word and a capacitance value of a capacitor of a given index is twice as high as a capacitance value of a capacitor of the previous index. The top plate of the sampling capacitor and the top plate of each capacitor in the array of capacitors are connected through the first on-off switch to the first rail and/or through the second on-off switch to the second rail and the bottom plate is connected through a change-over switch to ground of a circuit or to the source of auxiliary voltage. The first rail is connected to ground of the circuit through the first rail on-off switch and to the non-inverting input of the second comparator whose inverting input is connected to the source of the reference voltage. The second rail is connected to the inverting input of the first comparator whose non-inverting input is connected to the source of auxiliary voltage. The control inputs of the first on-off switches and the control inputs of the change-over switches in the array of capacitors are coupled together and connected appropriately to the control outputs of the control module while the control inputs of the second on-off switches and the control input of the first on-off switch are connected appropriately to the control outputs of the control module. The one end of the first current source is connected to the voltage supply and the one end of the second current source is connected to the second rail. The other end of the first current source and the other end of the second current source are connected to the first rail.

In one of variants of the abovementioned apparatus, the sampling capacitor whose capacitance value is not smaller than the capacitance value of the capacitor having the highest capacitance value in the array of capacitors is connected in parallel to the capacitor of the highest capacitance value in the array of capacitors. The conversion of a time interval to the digital word is realized by changing states of signals from the relevant control outputs by means of the control module.

According to the invention, the method for clockless conversion of a time interval to a digital word consists in that the beginning and the end of a time interval are detected by the use of the control module and this time interval is mapped by a portion of electric charge which is proportional to this time interval. Electric charge is delivered during the converted time interval by the use of the current source and accumulated in the sampling capacitor, or in the sampling capacitor and in the capacitor of the highest capacitance value in the array of redistribution. Then, the process of redistribution of the accumulated electric charge is realized in the array of redistribution in a known way by changing states of signals from the relevant control outputs by the use of the control module and the relevant values are assigned to bits in the digital word by means of the control module. The array of redistribution comprises the set of on-off switches, the set of change-over switches and the set of capacitors while a capacitance value of each capacitor of a given index is twice as high as a capacitance value of a capacitor of the previous index.

The essence of the method, according to the invention, consists in that as soon as accumulation of electric charge is terminated in the sampling capacitor, or in the sampling capacitor and in the capacitor of the highest capacitance value in the array of redistribution, which is connected to the sampling capacitor in parallel, and as soon as the beginning of next time interval is detected by means of the control module, electric charge is delivered by the use of the current source and accumulated in an additional sampling capacitor. Next the process of redistribution of electric charge accumulated in the additional sampling capacitor is realized and the relevant values are assigned to bits in the digital word by means of the control module. The accumulation of electric charge in the additional sampling capacitor, the process of redistribution of electric charge accumulated in the additional sampling capacitor and assignment of the relevant values to bits in the digital word by means of the control module are realized as for the sampling capacitor.

In this method, it is possible that as soon as the accumulation of electric charge is terminated in the additional sampling capacitor and as soon as the beginning of the time interval is detected by means of the control module, the next cycle begins and electric charge is delivered by the use of the current source and accumulated again in the additional sampling capacitor, or in the sampling capacitor and in the capacitor of the highest capacitance value in the array of redistribution, which is connected to the sampling capacitor in parallel.

In this method, it is possible that in a period of time when electric charge is delivered by the use of the current source and accumulated in the additional sampling capacitor, a part of delivered electric charge is accumulated simultaneously in the additional capacitor having the highest capacitance value in the array of redistribution which is connected to the additional sampling capacitor in parallel. A capacitance value of the additional capacitor having the highest capacitance value in the array of redistribution equals the capacitance value of the capacitor having the highest capacitance value in the array of redistribution.

In this method, it is also possible that as soon as the process of redistribution is terminated, the portion of electric charge, accumulated in the last of capacitors on which reference voltage had not been reached when the process of redistribution was realized, is conserved. This portion of electric charge is taken into account when the next process of redistribution is realized.

The apparatus, according to the invention, comprises the array of redistribution whose control inputs are connected to control outputs of the control module. The control module is equipped with the digital output, the complete conversion signal output, the trigger input, the first control input which is connected to the output of the first comparator and the other control input which is connected to the output of the second comparator. The source of auxiliary voltage, the section of the sampling capacitor and the second controlled current source are connected to the array of redistribution and the control input of the second controlled current source is connected to the output controlling the second current source. The one end of the second current source is connected to the source rail and the other end of the second current source is connected to the destination rail. The voltage supply is connected to the one end of the first current source whose control input is connected to the output controlling the first current source. The array of redistribution comprises the sections whose number equals the number of bits in the digital word. The section of the sampling capacitor and each section of the array of redistribution comprises the source on-off switch, the destination on-off switch, the ground change-over switch and at least one capacitor. The top plate of the sampling capacitor and the top plate of each capacitor in the array of redistribution is connected through the source on-off switch to the source rail and/or to the destination rail through the destination on-off switch and the bottom plate is connected through the ground change-over switch to ground of the circuit or to the source of auxiliary voltage. In the array of redistribution, a capacitance value of each capacitor of a given index is twice as high as a capacitance value of a capacitor of the previous index. The destination rail is connected through the destination rail on-off switch to ground of the circuit and is also connected to the non-inverting input of the second comparator whose inverting input is connected to the source of the reference voltage. The source rail is connected to the inverting input of the first comparator whose non-inverting input is connected to the source of auxiliary voltage. The control inputs of the source on-off switches and the control input of the destination rail on-off switch are connected appropriately to control outputs of the control module. The control inputs of destination on-off switches and the control inputs of the ground change-over switches are coupled together and connected appropriately to the control outputs of the control module.

A significant innovation of the apparatus is that the other end of the first current source is connected to the section of the sampling capacitor comprising the additional sampling capacitor, the top plate change-over switches and the bottom plate change-over switches. The top plate of the sampling capacitor and the top plate of the additional sampling capacitor are connected to the source on-off switch and to the destination on-off switch or to the other end of the first current source through the top plate change-over switches. The bottom plate of the sampling capacitor and the bottom plate of the additional sampling capacitor are connected to the ground change-over switch or to ground of the circuit though the bottom plate change-over switches. The control inputs of the top plate change-over switches and the control inputs of the bottom plate change-over switches are coupled together and connected to the output controlling change-over switches of the plates.

It is advantageous if at least one section of the array of redistribution comprises the additional capacitor and the top plate change-over switches and the bottom plate change-over switches. The top plate of the capacitor and the top plates of the additional capacitor of such section are connected to the source on-off switch and to the destination on-off switch or to the other end of the first current source through the top plate change-over switches. The bottom plate of the capacitor and the bottom plate of the additional capacitor of such section are connected to the ground change-over switch or to ground of the circuit through the bottom plate change-over switches. The control inputs of the change-over top plate switches and the control inputs of bottom plate change-over switches are coupled together and connected to the output controlling change-over switches of the plates.

It is advantageous if the capacitance values of the sampling capacitor and of the additional sampling capacitor are not smaller than the capacitance value of the capacitor having the highest capacitance value in the array of redistribution.

It is also advantageous if the capacitance value of the additional capacitor in the array of redistribution equals appropriately the capacitance value of the capacitor in the array of redistribution.

Due to the accumulation of a portion of charge representing the next converted time interval in the additional sampling capacitor, it is possible to realize a conversion of two successive time intervals without a need to introduce a break to realize the process of redistribution of a portion of charge representing the previous time interval and to realize the relaxation phase. The accumulation of a portion of electric charge representing the next converted time interval in the additional sampling capacitor is realized simultaneously to the process of redistribution of the portion of charge representing the previous time interval and accumulated previously in the sampling capacitor.

In this way, the results of each conversion are presented with minimal delay equal to the time of realization of the process of charge redistribution. Moreover, the realization of actions related to the conversions of both time intervals by the same control module, by the array of redistribution, by the set of comparators and by the set the current sources contributes to a reduction of amount of energy consumed per single conversion by the apparatus and in this way increases energy efficiency of its operation. A start of a new conversion cycle after the detection of the end of the actual time interval enables the conversion of two successive time intervals by means of a single apparatus.

A use of a parallel connection of the additional capacitor having the highest capacitance value in the array of redistribution to the additional sampling capacitor allows the required capacitance value of the sampling capacitor to be reduced twice and enables a significant reduction of area occupied by a converter produced in a form of the monolithic integrated circuit. Due to a parallel connection of the additional sampling capacitor to the additional capacitor having the highest capacitance value in the array of redistribution, the maximum voltage value created on the additional sampling capacitor having the reduced capacitance value is not increased. Furthermore the time of realization of redistribution of charge, accumulated in the additional sampling capacitor and in the additional capacitor having the highest capacitance value in the array of redistribution connected to the additional sampling capacitor in parallel, is smaller at least by 25%.

Conserving in the apparatus a small portion of charge which has not been taken into consideration in the value of a digital word is also an advantage. The inclusion of the abovementioned portion of charge during the process of redistribution of the subsequent accumulated charge portion together with elimination of the need to introduce breaks between consecutive conversions causes that the sum of digital words representing a sequence of converted time intervals with the resolution defined by the quantization error.

The subject of the invention is explained in the exemplary realizations by means of figures where the apparatus is shown at different phases of conversion process represented by different states of on-off switches and change-over switches:

Figure 1:
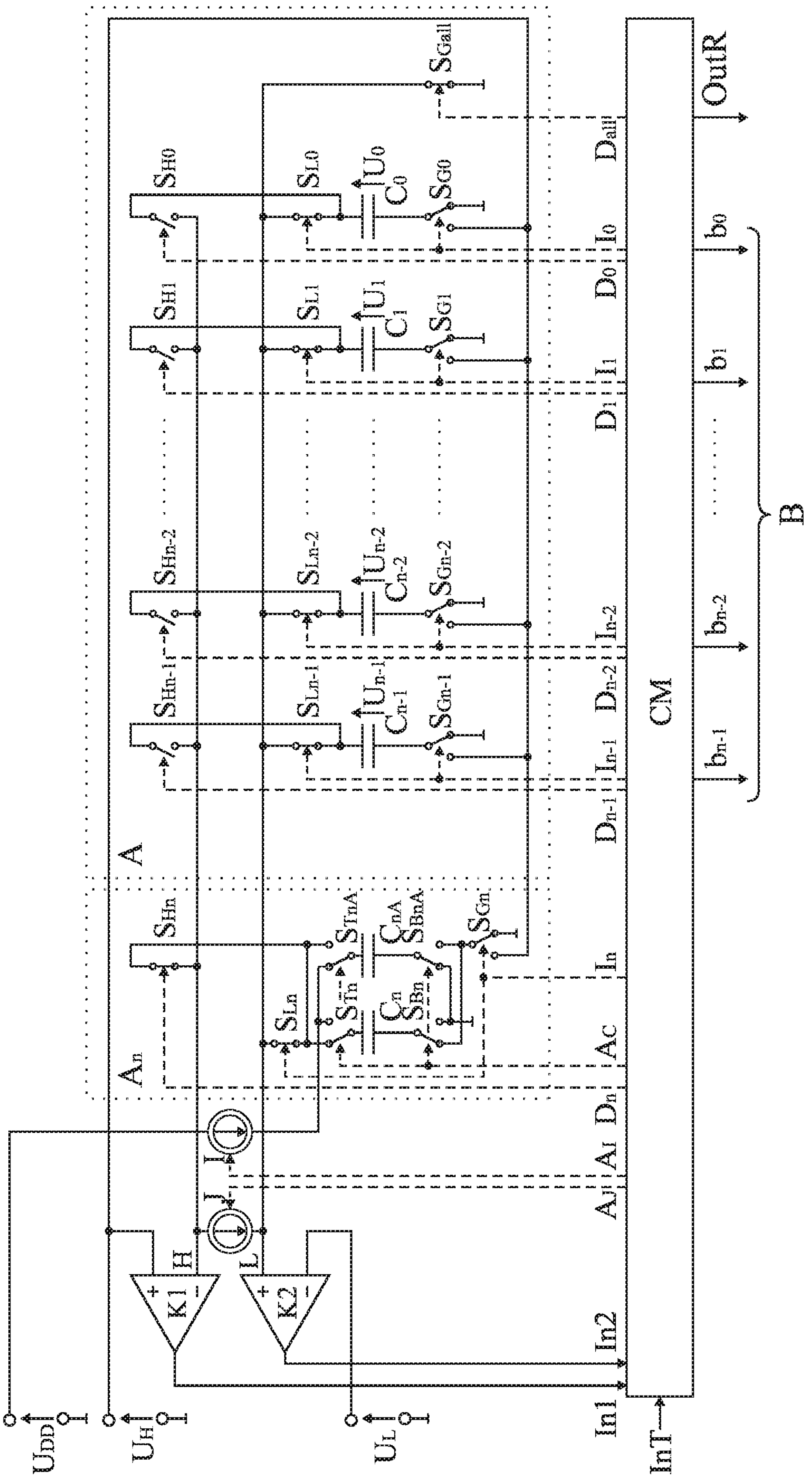
FIG. 1 illustrates the schematic diagram of the apparatus in the phase of relaxation before the beginning of the conversion process.

According to the invention, the method for clockless conversion of a time interval to a digital word consists in that the beginning and the end of the time interval $T_x$ are detected by the use of the control module CM and this time interval is mapped by a portion of electric charge which is proportional to that converted time interval. Electric charge is delivered by the use of the first current source I during the time interval $T_x$ and accumulated in the sampling capacitor $C_n$. Then, the process of redistribution of the accumulated charge is realized in the array of redistribution A by means of the control module CM by changing the states of the signals from the relevant control outputs and the relevant values are assigned to the bits $b_{n-1}, b_{n-2}, \ldots, b_1, b_0$ in digital word by means of the control module CM. The array of redistribution A comprises the set of on-off switches, the set of change-over switches and the set of capacitors while a capacitance value of a capacitor of a given index is twice as high as a capacitance value of a capacitor of the previous index.

As soon as accumulation of charge in the sampling capacitor $C_n$ is terminated and when the beginning of next time interval $T_{x+1}$ is detected by means of the control module CM, the charge is delivered by the use of the first current source I and accumulated in the additional sampling capacitor $C_{nA}$. Next, the process of redistribution of charge accumulated in the additional sampling capacitor $C_{nA}$ is realized and the relevant values are assigned to the bits $b_{n-1}, b_{n-2}, \ldots, b_1, b_0$ in the digital word by means of the control module CM. The accumulation of charge in the additional sampling capacitor $C_{nA}$, the process of redistribution of charge accumulated in the additional sampling capacitor $C_{nA}$ and the assignment of relevant values to the bits $b_{n-1}, b_{n-2}, \ldots, b_1, b_0$ in the digital word are realized in the same way as for the sampling capacitor $C_n$.

The another exemplary solution is characterized in that as soon as accumulation of electric charge in the additional sampling capacitor $C_{nA}$ is terminated and when the beginning of the subsequent time interval $T_{x+2}$ is detected by means of the control module CM, the next cycle begins and the charge is delivered by the use of the first current source I and accumulated in the sampling capacitor $C_n$ again.

The another exemplary solution is characterized in that during the next time interval $T_{x+1}$ when the charge is delivered by the use of the first current source I and accumulated in the additional sampling capacitor $C_{nA}$, a part of delivered charge is accumulated simultaneously in the additional capacitor $C_{n-1A}$ having the highest capacitance value in the array of redistribution which is connected to the additional sampling capacitor $C_{nA}$ in parallel. The capacitance value of the additional capacitor $C_{n-1A}$ having the highest capacitance value in the array of redistribution is equal to the capacitance value of the capacitor $C_{n-1}$ having the highest capacitance value in the array of redistribution.

The another exemplary solution is characterized in that as soon as the process of redistribution is terminated in the last of capacitors on which reference voltage $U_L$ had not been reached when the process of redistribution is realized, the charge accumulated in the last of capacitors is conserved.

In detail, the abovementioned process of redistribution in the exemplary solution is presented as follows.

As soon as accumulation of electric charge in the sampling capacitor $C_n$ is terminated, the function of the source capacitor $C_i$, whose index is defined by the content of the source index register, is assigned by means of the control module CM to the sampling capacitor $C_n$ by writing the value of the index of the sampling capacitor $C_n$ to this register. Simultaneously, the function of the destination capacitor $C_k$, whose index is defined by the content of the destination index register, is assigned by means of the control module CM to the capacitor $C_{n-1}$ having the highest capacitance value in the array of redistribution by writing the value of the index of the capacitor $C_{n-1}$ to this register. Then, the process of redistribution of the accumulated charge is realized by transfer of the charge from the source capacitor $C_i$ to the destination capacitor $C_k$ by the use of the second current source J having the effectiveness twice as high as the effectiveness of the first current source I.

At the same time, the voltage $U_k$ increasing on the destination capacitor $C_k$ is compared to the reference voltage $U_L$ by the use of the second comparator K2, and also the voltage $U_i$ on the source capacitor $C_i$ is observed by the use of the first comparator K1.

When the voltage $U_i$ on the source capacitor $C_i$ observed by the use of the first comparator K1 equals zero during the charge transfer, the function of the source capacitor $C_i$ is assigned to the current destination capacitor $C_k$ by means of the control module CM on the basis of the output signal of the first comparator K1 by writing the current content of the destination index register to the source index register, and the function of the destination capacitor $C_k$ is assigned to the subsequent capacitor in the array of redistribution A whose capacitance value is twice lower than the capacitance value of the capacitor that acted as the destination capacitor directly before by reducing the content of the destination index register by one, and the charge transfer from a new source capacitor $C_i$ to a new destination capacitor $C_k$ is continued by the use of the second current source J.

When the voltage $U_k$ on the destination capacitor $C_k$ observed by the use of the second comparator K2 equals the reference voltage $U_L$ during the transfer of charge from the source capacitor $C_i$ to the destination capacitor $C_k$, the function of the destination capacitor $C_k$ is assigned by means of the control module CM on the basis of the output signal of the second comparator K2 to the subsequent capacitor in the array of redistribution A whose capacitance value is twice lower than the capacitance value of the capacitor that acted as the destination capacitor directly before by reducing the content of the destination index register by one, and also the charge transfer from the source capacitor $C_i$ to a new destination capacitor $C_k$ is continued.

The process of redistribution is still controlled by means of the control module CM on the basis of the output signals of both comparators (K1 and K2) until the voltage $U_i$ on the source capacitor $C_i$ observed by the use of the first comparator K1 equals zero during the period of time when the function of the destination capacitor $C_k$ is assigned to the capacitor $C_0$ having the lowest capacitance value in the array of redistribution, or the voltage $U_0$ increasing on the capacitor $C_0$ having the lowest capacitance value in the array of redistribution and observed at the same time by the use of the second comparator K2 equals the reference voltage $U_L$. The value one is assigned to the bits in the digital word corresponding to the capacitors in the array of redistribution on which the voltage equal to the reference voltage value $U_L$ has been obtained, and the value zero is assigned to the other bits by means of the control module CM.

According to the invention, the apparatus for clockless conversion of the time interval to the digital word comprises the array of redistribution A whose control inputs are connected to control outputs of the control module CM. The control module CM is equipped with the digital output B, the complete conversion output OutR, the time interval signal input InT, the first control input In1 connected to the output of the first comparator K1 and the other control input In2 connected to the output of the second comparator K2. The source of auxiliary voltage $U_H$, the section of the sampling capacitor $A_n$ and the second controlled current source J having the effectiveness twice as high as the effectiveness of the first current source I are connected to the array of redistribution A. The control input of the second current source J is connected to the output controlling the current source $A_J$. The one end of the second current source J is connected to the source rail H and the other end of the second current source J is connected to the destination rail L. The voltage supply $U_{DD}$ is connected to the one end of the first current source I whose control input is connected to the output controlling the first current source $A_I$.

The array of redistribution comprises the sections whose number n equals the number of bits in the digital word. The section of the sampling capacitor $A_n$ and the sections of the array of redistribution A comprise the source on-off switches $S_{Hn}$; $S_{Hn-1}$, $S_{Hn-2}$, . . . , $S_{H1}$, $S_{H0}$, the destination on-off switches $S_{Ln}$; $S_{Ln-1}$, $S_{Ln-2}$, . . . , $S_{L1}$, $S_{L0}$, the ground change-over switches $S_{Gn}$; $S_{Gn-1}$, $S_{Gn-2}$, . . . , $S_{G1}$, $S_{G0}$ and the capacitors $C_n$; $C_{n-1}$, $C_{n-2}$, . . . , $C_1$, $C_0$. The top plates of the capacitors $C_{n-1}$, $C_{n-2}$, . . . , $C_1$, $C_0$ of the array of redistribution are connected to the source rail H through the source on-off switches $S_{Hn-1}$, $S_{Hn-2}$, . . . , $S_{H1}$, $S_{H0}$ and to the destination rail L through the destination on-off switches, $S_{Ln-1}$, $S_{Ln-2}$, . . . , $S_{L1}$, $S_{L0}$. The bottom plates of these capacitors are connected to ground of the circuit and to the source of auxiliary voltage $U_H$ through the ground change-over switches $S_{Gn-1}$, $S_{Gn-2}$, . . . , $S_{G1}$, $S_{G0}$. In the array of redistribution A, a capacitance value of each capacitor $C_{n-1}$, $C_{n-2}$, . . . , $C_1$, $C_0$ of a given index is twice as high as a capacitance value of a capacitor of the previous index. The capacitance value of the sampling capacitor $C_n$ is twice as high as the capacitance value of the capacitor $C_{n-1}$ having the highest capacitance value in the array of redistribution. The relevant bit $b_{n-1}$, $b_{n-2}$, . . . , $b_1$, $b_0$ in the digital word is assigned to each capacitor $C_{n-1}$, $C_{n-2}$, . . . , $C_1$, $C_0$ in the array of redistribution. The destination rail L is connected through the destination rail on-off switch $S_{Gall}$ to ground of the circuit and is also connected to the non-inverting input of the second comparator K2 whose inverting input is connected to the source of the reference voltage $U_L$. The source rail H is connected to the inverting input of the first comparator K1 whose non-inverting input is connected to the source of auxiliary voltage $U_H$. The control inputs of the source on-off switches $S_{Hn}$; $S_{Hn-1}$, $S_{Hn-2}$, . . . , $S_{H1}$, $S_{H0}$ and the control inputs of the destination rail on-off switch $S_{Gall}$ are connected appropriately to the control outputs $D_n$; $D_{n-1}$, $D_{n-2}$, . . . , $D_1$, $D_0$; $D_{all}$. The control inputs of the destination on-off switches $S_{Ln}$; $S_{Ln-1}$, $S_{Ln-2}$, . . . , $S_{L1}$, $S_{L0}$ and the control inputs of the ground change-over switches $S_{Gn}$; $S_{Gn-1}$, $S_{Gn-2}$, . . . , $S_{G1}$, $S_{G0}$ are coupled together and connected appropriately to the control outputs $I_n$; $I_{n-1}$, $I_{n-2}$, . . . , $I_1$, $I_0$.

The other end of the first current source I is connected to the section of the sampling capacitor $A_n$ comprising the additional sampling capacitor $C_{nA}$, the top plate change-over switches $S_{Tn}$, $S_{TnA}$ and the bottom plate change-over switches $S_{Bn}$, $S_{BnA}$. The capacitance value of the additional sampling capacitor $C_{nA}$ is equal to the capacitance value of the sampling capacitor $C_n$. The top plate of the sampling capacitor $C_n$ and the top plate of the additional sampling capacitor $C_{nA}$ are connected to the source on-off switch $S_{Hn}$, to the destination on-off switch $S_{Ln}$ and to the other end of the first current source I through the top plate change-over switches $S_{Tn}$, $S_{TnA}$. The bottom plates of the sampling capacitor $C_n$ and the bottom plates of the additional sampling capacitor $C_{nA}$ are connected to the ground change-over switch $S_{Gn}$ and to ground of the circuit through the bottom plate change-over switches $S_{Bn}$, $S_{BnA}$. The control inputs of the top plate change-over switches $S_{Tn}$, $S_{TnA}$ and the control inputs of the bottom plate change-over switches $S_{Bn}$, $S_{BnA}$ are coupled together and connected to the output controlling the change-over switches of the plates $A_C$. The source on-off switch $S_{Hn}$ is connected to the source rail H, the destination on-off switch $S_{Ln}$ is connected to the destination rail L and the ground change-over switch $S_{Gn}$ is connected to ground of the circuit and to the source of auxiliary voltage $U_H$.

In the another exemplary solution, the section of the capacitor $C_{n-1}$ having the highest capacitance value in the array of redistribution comprises the additional capacitor $C_{n-1A}$ having the highest capacitance value in the array of redistribution, the top plate change-over switches $S_{Tn-1}$, $S_{Tn-1A}$ and the bottom plate change-over switches $S_{Bn-1}$, $S_{Bn-1A}$. The capacitance value of the additional capacitor $C_{n-1A}$ having the highest capacitance value in the array of redistribution is equal to the capacitance value of the capacitor $C_{n-1}$ having the highest capacitance value in the array of redistribution. The top plates of the capacitor $C_{n-1}$ having the highest capacitance value in the array of redistribution and the top plates of the additional capacitor $C_{n-1A}$ having the highest capacitance value in the array of redistribution are connected to the source on-off switch $S_{Hn-1}$, to the destination on-off switch $S_{Ln-1}$ and to the other end of the first current source I through the top plate change-over switches $S_{Tn-1}$, $S_{Tn-1A}$. The bottom plates of the capacitor $C_{n-1}$ having the highest capacitance value in the array of redistribution and the top plates of the additional capacitor $C_{n-1A}$ having the highest capacitance value in the array of redistribution are connected to the ground change-over switch $S_{Gn-1}$ and to ground of the circuit through the bottom plate change-over switches $S_{Bn-1}$ $S_{Bn-1A}$. The control inputs of the top plate change-over switches $S_{Tn-1}$, $S_{Tn-1A}$ and the control inputs of the bottom plate change-over switches $S_{Bn-1}$, $S_{Bn-1A}$ are coupled together and connected to the output controlling the change-over switches of the plates $A_C$.

The method for conversion of a time interval to the digital word, according to the invention, is presented in the first exemplary apparatus as follows. Before the first process of conversion of a time interval to the digital word having the number of bits equal to n, the control module CM introduces the complete conversion output OutR to the inactive state. The control module CM by the use of the signal from the output controlling the first current source $A_I$ causes the switching off the first current source I and by the use of the signal from the output controlling the second current source $A_J$ causes the switching off the second current source J. By the use of the signal from the output controlling the change-over switches of the plates $A_C$, the control module CM causes the switching of the top plate change-over switches $S_{Tn}$, $S_{TnA}$ and of the bottom plate change-over switches $S_{Bn}$, $S_{BnA}$ and the connection of the top plate of the sampling capacitor $C_n$ to the source on-off switch $S_{Hn}$ and to the destination on-off switch $S_{Ln}$, the connection of the top plate of the additional sampling capacitor $C_{nA}$ to the other end of the first current source I, the connection of the bottom plate of the sampling capacitor $C_n$ to the ground change-over switch $S_{Gn}$ and the connection of the bottom plate of the additional sampling capacitor $C_{nA}$ to ground of the circuit. Next, the control module CM introduces the apparatus into the relaxation state shown in FIG. 1. Therefore, the control module CM causes the opening of the source on-off switches $S_{Hn-1}$, $S_{Hn-2}$, . . . , $S_{H1}$, $S_{H0}$ by the use of the signals from the control outputs $D_{n-1}$, $D_{n-2}$, . . . , $D_1$, $D_0$. Furthermore, by the use of the signals from the control outputs $I_n$; $I_{n-1}$, $I_{n-2}$, . . . , $I_1$, $I_0$, the control module CM causes the closure of the destination on-off switches $S_{Ln}$; $S_{Ln-1}$, $S_{Ln-2}$, . . . , $S_{L1}$, $S_{L0}$ and the connection of the top plate of the sampling capacitor $C_n$ and the top plates of all the capacitors $C_{n-1}$, $C_{n-2}$, . . . , $C_1$, $C_0$ in the array of redistribution to the destination rail L, the switching of the ground change-over switches $S_{Gn}$; $S_{Gn-1}$, $S_{Gn-2}$, . . . , $S_{G1}$, $S_{G0}$ and the connection of the bottom plate of the sampling capacitor $C_n$ and the bottom plates of all the capacitors $C_{n-1}$, $C_{n-2}$, . . . , $C_1$, $C_0$ in the array of redistribution to ground of the circuit. By the use of the signal from the control output $D_{all}$, the control module CM causes the closure of the destination rail on-off switch $S_{Gall}$ and the connection of the destination rail L to ground of the circuit enforcing a complete discharge of the sampling capacitor $C_n$ and of all the capacitors $C_{n-1}$, $C_{n-2}$, . . . , $C_1$, $C_0$ in the array of redistribution. At the same time, by the use of signal from the control output $D_n$, the control module CM causes the closure of the source on-off switch $S_{Hn}$ and the connection of the source rail H to the destination rail L and to ground of the circuit which prevents the occurrence of a random potential on the source rail H.

Figure 2:
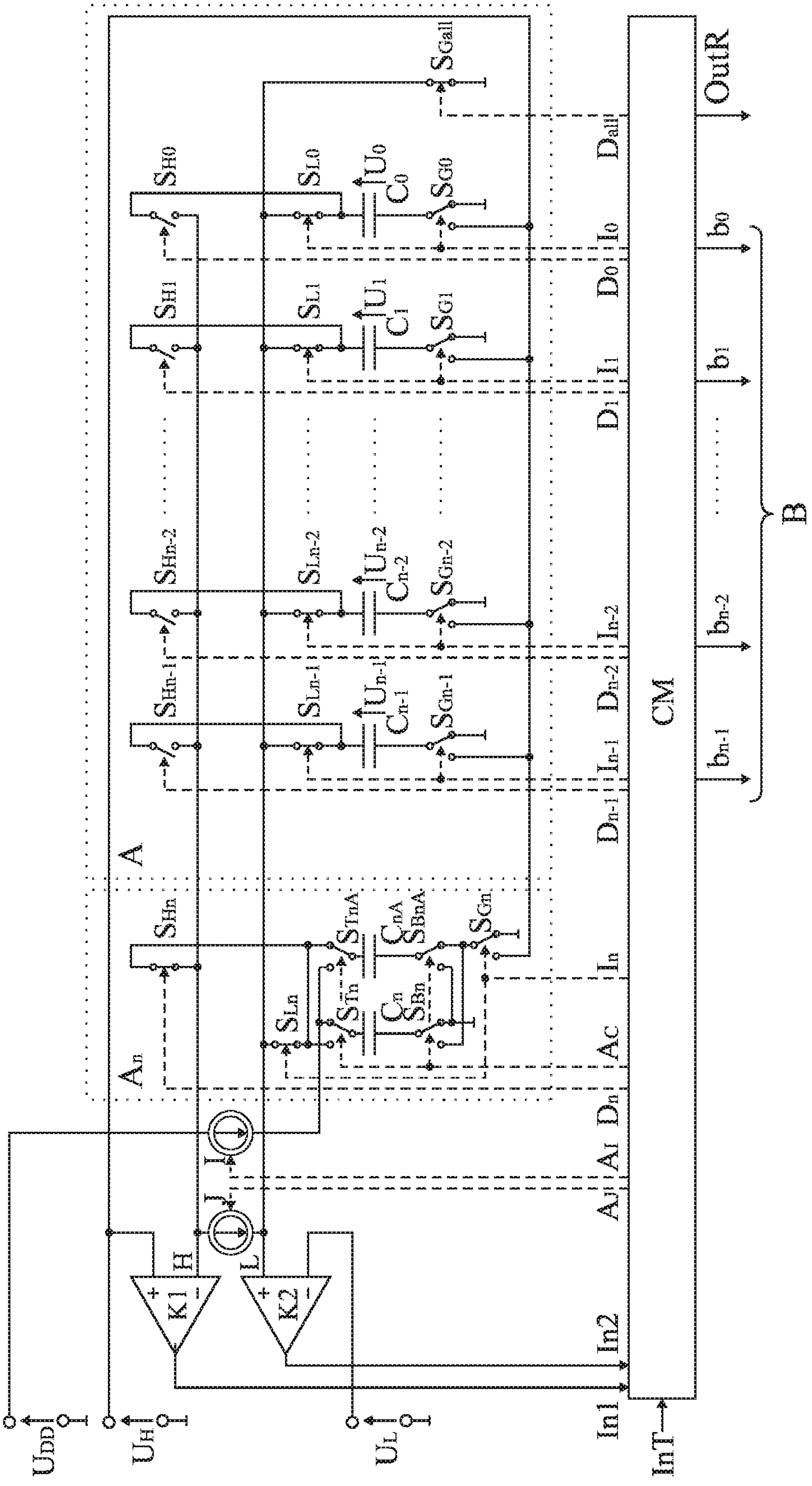
FIG. 2 illustrates the schematic diagram of the apparatus during accumulation of electric charge in the sampling capacitor $C_n$.

As soon as the beginning of the time interval $T_x$ is detected on the time interval signal input InT by the module CM, the apparatus is introduced into the state shown in FIG. 2 by the use of the module CM. Therefore, by the use of the signal from the output controlling the change-over switches of the plates $A_C$, the control module CM causes the switching of the top plate change-over switches $S_{Tn}$, $S_{TnA}$ and switching of the bottom plate change-over switches $S_{Bn}$, $S_{BnA}$ and the connection of the top plate of the sampling capacitor $C_n$ to the other end of the first current source I, the connection of the top plate of the additional sampling capacitor $C_{nA}$ to the source on-off switch $S_{Hn}$ and to the destination on-off switch $S_{Ln}$, the connection of the bottom plate of the sampling capacitor $C_n$ to ground of the circuit and the connection of the bottom plate of the additional sampling capacitor $C_{nA}$ to the ground change-over switch $S_{Gn}$ enforcing a complete discharge of the additional sampling capacitor $C_{nA}$. Next, the control module CM by the use of the signal from the output controlling the first current source $A_I$ causes the switching on the first current source I. Electric charge delivered by the use of the first current source I is accumulated in the sampling capacitor $C_n$ which as the only capacitor is then connected to the other end of the first current source I through the top plate change-over switch $S_{Tn}$.

Figure 3:
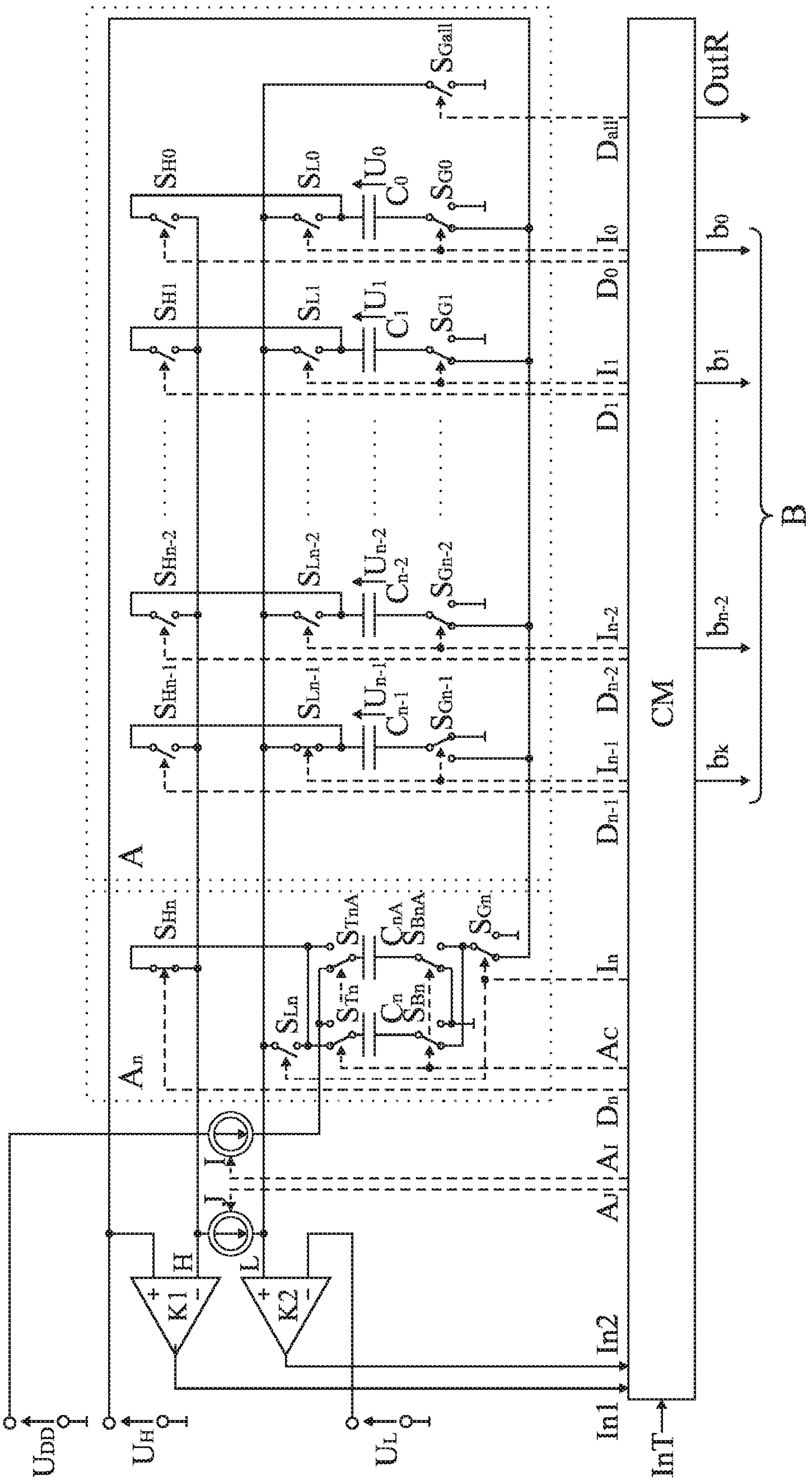
FIG. 3 illustrates the schematic diagram at the beginning of redistribution of charge accumulated in the sampling capacitor $C_n$.

As soon as the end of the time interval $T_x$ is detected by the control module CM on the time interval signal input InT, the control module CM introduces the apparatus into the state shown in FIG. 3. Therefore, by the use of the signal from the control output $D_{all}$, the control module CM causes the opening of the destination rail on-off switch $S_{Gall}$ and the disconnection of the destination rail L from ground of the circuit. By the use of the signals from control outputs $I_n$; $I_{n-2}$, . . . , $I_1$, $I_0$, the control module CM causes the opening of the destination on-off switches $S_{Ln}$; $S_{Ln-2}$, . . . , $S_{L1}$, $S_{L0}$ and the disconnection of the top plate of the additional sampling capacitor $C_{nA}$ and the top plates of the capacitors $C_{n-2}$, . . . , $C_1$, $C_0$ in the array of redistribution from the destination rail L, the switching of the ground change-over switches $S_{Gn}$; $S_{Gn-2}$, . . . , $S_{G1}$, $S_{G0}$ and the connection of the bottom plate of the additional sampling capacitor $C_{nA}$ and the bottom plates of the capacitors $C_{n-2}$, . . . , $C_1$, $C_0$ in the array of redistribution to the source of auxiliary voltage $U_H$. By the use of the signal from the output controlling the change-over switches of the plates $A_C$, the control module CM causes the switching of the top plate change-over switches $S_{Tn}$, $S_{TnA}$ and of the bottom plate change-over switches $S_{Bn}$, $S_{BnA}$ and the connection of the top plate of the sampling capacitor $C_n$ to the source on-off switch $S_{Hn}$ and to the destination on-off switch $S_{Ln}$, the connection of the top plate of the additional sampling capacitor $C_{nA}$ to the other end of the first current source I, the connection of the bottom plate of the sampling capacitor $C_n$ to the ground change-over switch $S_{Gn}$ and the connection of the bottom plate of the additional sampling capacitor $C_{nA}$ to ground of the circuit.

Figure 4:
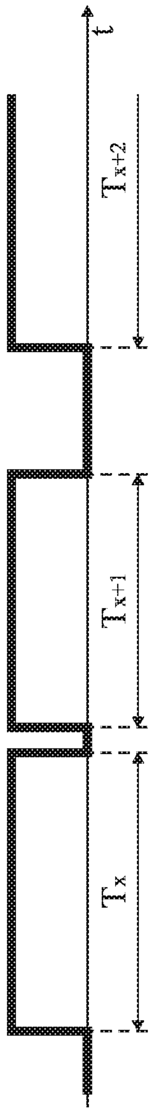
FIG. 4 illustrates exemplary sequence of converted time intervals.

If the end of the time interval $T_x$ detected by the control module CM does not constitute the beginning of the next time interval $T_{x+1}$ as it is shown in FIG. 4, the control module CM by the use of the signal from the output controlling the first current source $A_I$ causes the switching off the first current source I.

As soon as the beginning of the next time interval $T_{x+1}$ is detected by the control module CM on the time interval signal input InT, the control module CM by the use of the signal from the output controlling the first current source $A_I$ causes again the switching on the first current source I. The charge is delivered by the use of the first current source I and accumulated in the additional sampling capacitor $C_{nA}$ which as the only capacitor is then connected to the other end of the first current source I through the top plate change-over switch $S_{TnA}$.

Figure 5:
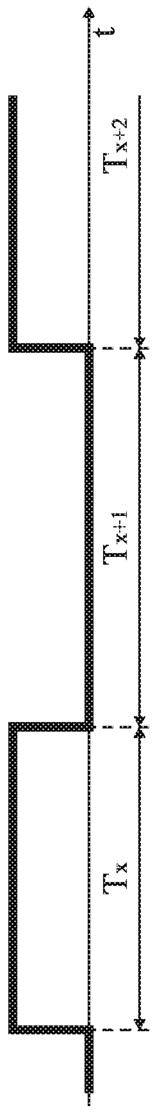
FIG. 5 illustrates exemplary sequence of converted time intervals which occur immediately after themselves.

If the end of the time interval $T_x$ detected by the control module CM determines simultaneously the beginning of the next time interval $T_{x+1}$ as it is shown in FIG. 5, the charge delivered still by the use of the first current source I is accumulated in the additional sampling capacitor $C_{nA}$ which as the only capacitor is then connected the other end of the first current source I through the top plate change-over switch $S_{TnA}$.

In both cases, the control module CM introduces the complete conversion output OutR into the inactive state and assigns the initial value zero to all the bits $b_{n-1}, b_{n-2}, \ldots, b_1, b_0$ in the digital word. Then, the control module CM assigns the function of the source capacitor $C_i$ to the sampling capacitor $C_n$ by writing the value of the index of the sampling capacitor to the source index register. Simultaneously, the control module CM assigns the function of the destination capacitor $C_k$ to the capacitor $C_{n-1}$ having the highest capacitance value in the array of redistribution by writing the value of the index of the capacitor having the highest capacitance value in the array of redistribution to the destination index register. Next, the control module CM starts to realize the process of redistribution of the accumulated electric charge. Therefore, the control module CM by the use of the signal from the output controlling the second current source A, causes the switching on the second current source J. The charge accumulated in the source capacitor $C_i$ is transferred to the destination capacitor $C_k$ by the use of the second current source J though the source rail H and though the destination rail L and the voltage $U_i$ on the source capacitor gradually decreases and at the same time the voltage $U_k$ on the destination capacitor gradually increases during the charge transfer.

Figure 6:
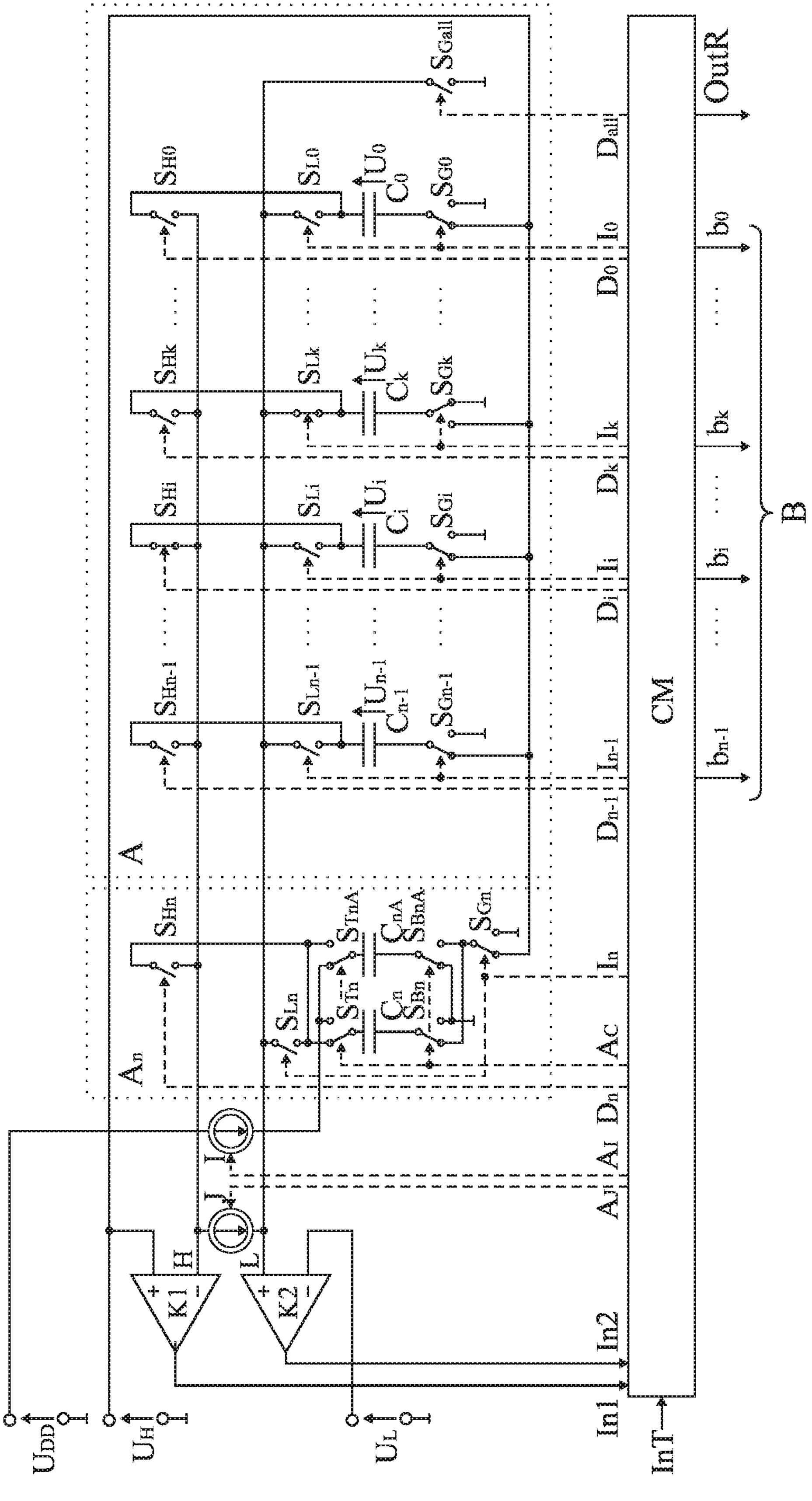
FIG. 6 illustrates the schematic diagram of the apparatus during the charge transfer from the source capacitor $C_i$ to the destination capacitor $C_k$.

In case when the voltage $U_k$ on the current destination capacitor $C_k$ reaches the reference voltage $U_L$ value, then the value one is assigned by the control module CM to the appropriate bit $b_k$ in the digital word on the basis of the output signal of the second comparator K2. By the use of the signal from the control output $I_k$, the control module CM causes the opening of the destination on-off switch $S_{Lk}$ and the disconnection of the top plate of the destination capacitor $C_k$ from the destination rail L, the simultaneous switching of the ground change-over switch $S_{Gk}$ and the connection of the bottom plate of the destination capacitor $C_k$ to the source of auxiliary voltage $U_H$. Next, the control module CM assigns the function of the destination capacitor $C_k$ to the subsequent capacitor in the array of redistribution A whose capacitance value is twice lower than the capacitance value of the capacitor that acted as the destination comparator $C_k$ directly before by reducing the content of the destination index register by one. By the use of the signal from the control output $I_k$, the control module CM causes the closure of the destination on-off switch $S_{Lk}$ and the connection of the top plate of a new destination capacitor $C_k$ to the destination rail L, the simultaneous switching of the ground change-over switch $S_{Gk}$ and the connection of the bottom plate of the destination capacitor $C_k$ to ground of the circuit. In case when the voltage $U_i$ on the source capacitor reaches the value zero during charge transfer, then the control module CM on the basis of the output signal of the first comparator K1 by the use of the signal from the control output $D_i$ causes the opening of the source on-off switch $S_{Hi}$ and the disconnection of the top plate of the source capacitor $C_i$ from the source rail H. By the use of the signal from the control output $I_k$, the control module CM causes the opening of the destination on-off switch $S_{Lk}$ and the disconnection of the top plate of the destination capacitor $C_k$ from the destination rail L, the simultaneous switching of the ground change-over switch $S_{Gk}$ and the connection of the bottom plate of the destination capacitor $C_k$ to the source of auxiliary voltage $U_H$. Next, the function of the source capacitor $C_i$ is assigned by the control module CM to the capacitor that acted as the destination capacitor $C_k$ directly before by writing the current content of the destination index register to the source index register. The control module CM by the use of the signal from the control output $D_i$ causes the closure of the source on-off switch $S_{Hi}$ and the connection of the top plate of a new source capacitor $C_i$ to the source rail H. Then, the control module CM reduces the content of the destination index register by one and assigns the function of the destination capacitor $C_k$ to the next capacitor in the array of redistribution A having a capacitance value twice lower than the capacitance value of the capacitor that acted as the destination capacitor $C_k$ directly before. By the use of the signal from the control output $I_k$, the control module CM causes the closure of the destination on-off switch $S_{Lk}$ and the connection of the top plate of a new destination capacitor $C_k$ to the destination rail L, the simultaneous switching of the ground change-over switch $S_{Gk}$ and the connection of the bottom plate of a new destination capacitor $C_k$ to ground of the circuit. FIG. 6 presents the apparatus in the abovementioned state.

In both abovementioned cases, the control module CM continues the process of electric charge redistribution on the basis of the output signals of the first comparator K1 and of the second comparator K2. Each occurrence of the active state on the output of the second comparator K2 causes the assignment of the function of the destination capacitor $C_k$ to the subsequent capacitor in the array of redistribution A whose capacitance value is twice as lower as the capacitance value of the capacitor which acted as the destination capacitor $C_k$ directly before. On the other hand, each occurrence of the active state on the output of first comparator K1 causes the assignment of the function of the source capacitor $C_i$ to the capacitor in the array of redistribution A that until now has acted as the destination capacitor $C_k$, and at the same time the assignment of the function of the destination capacitor $C_k$ to the subsequent capacitor in the array A whose capacitance value is twice as lower as the capacitance value of the capacitor which acted as the destination capacitor directly before. The process of redistribution is terminated when the capacitor $C_0$ having the lowest capacitance value in the array of redistribution A stops to act as the destination capacitor $C_k$. Such situation occurs when the active state appears on the output of the first comparator K1 or on the output of the second comparator K2 during charge transfer to the capacitor $C_0$ having the lowest capacitance value in the array of redistribution A. When the active state appears on the output of the second comparator K2, the control module CM assigns the value one to the bit $b_0$. After termination of redistribution of charge accumulated previously in the sampling capacitor $C_n$ and after assigning the corresponding values to the bits $b_{n-1}$, $b_{n-2}$, . . . , $b_1$, $b_0$ in the output digital word, the control module CM activates the signal provided on the complete conversion signal output OutR. By the use of the signal from the output controlling the second current source $A_J$, the control module CM causes the switching off the second current source J. Next, the control module CM introduces the apparatus into the relaxation phase shown in FIG. 1.

Figure 7:
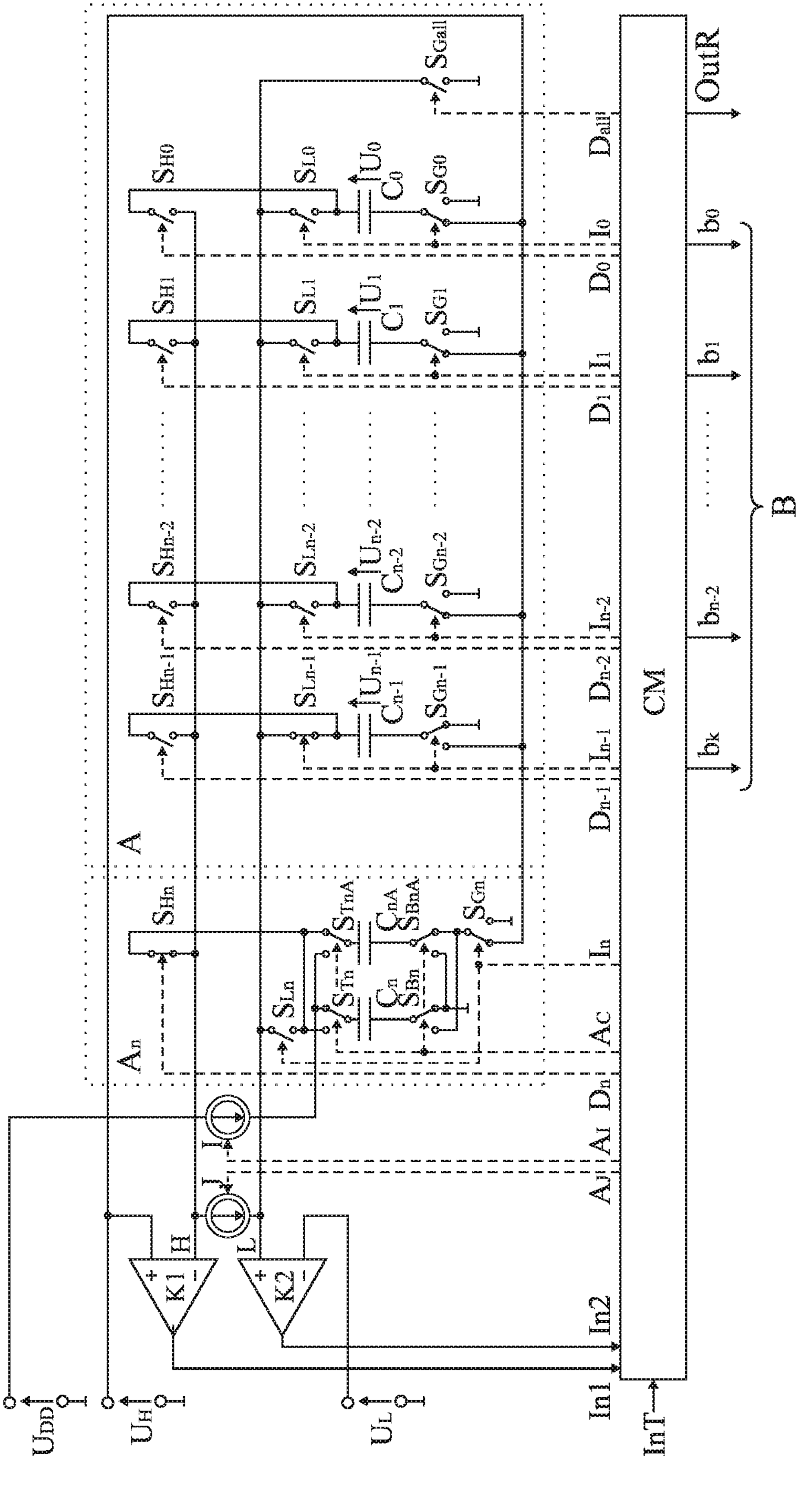
FIG. 7 illustrates the schematic diagram at the beginning of redistribution of charge accumulated in the additional sampling capacitor $C_{nA}$.

After detecting the end of the next time interval $T_{x+1}$ by the control module CM on the time interval signal input InT, the control module CM introduces the apparatus into the state shown in FIG. 7. Therefore, the control module CM by the use of the signal from the control output $D_{all}$ causes the opening of the destination rail on-off switch $S_{Gall}$ and the disconnection of the destination rail L from ground of the circuit. The control module CM by the use of signals from the control outputs $I_n$; $I_{n-2}$, . . . , $I_1$, $I_0$ causes the opening of the destination on-off switches $S_{Ln}$; $S_{Ln-2}$, . . . , $S_{L1}$, $S_{L0}$ and the disconnection of the top plates of the sampling capacitor $C_n$ and of the capacitors $C_{n-2}$, . . . , $C_1$, $C_0$ in the array of redistribution from the destination rail L, the switching of the ground change-over switches $S_{Gn}$; $S_{Gn-2}$, . . . , $S_{G1}$, $S_{G0}$ and the connection of the bottom plate of the sampling capacitor $C_n$ and the bottom plates of the capacitors $C_{n-2}$, . . . , $C_1$, $C_0$ in the array of redistribution to the source of auxiliary voltage $U_H$. By the use of the signal from the output controlling change-over switches of the plates $A_C$, the control module CM causes the switching of the top plate change-over switches $S_{Tn}$, $S_{TnA}$ and of the bottom plate change-over switches $S_{Bn}$, $S_{BnA}$ and the connection of the top plate of the sampling capacitor $C_n$ to the other end of the first current source I, the connection of the top plate of the additional sampling capacitor $C_{nA}$ to the source on-off switch $S_{Hn}$ and to the destination on-off switch $S_{Ln}$, the connection of the bottom plate of the sampling capacitor $C_n$ to ground of the circuit and the connection of the bottom plate of the additional sampling capacitor $C_{nA}$ to the ground change-over switch $S_{Gn}$.

In case when the end of the time interval $T_{x+1}$ detected by the control module CM does not constitute simultaneously the beginning of the subsequent time interval $T_{x+2}$ as it is shown in FIG. 4, the control module CM by the use of the signal from the output controlling the first current source $A_I$ causes the switching off the first current source I. As soon as the beginning of the subsequent time interval $T_{x+2}$ is detected by the control module CM on the time interval signal input InT, the control module CM by the use of the signal from the output controlling the first current source $A_I$ causes again the switching on the first current source I. The charge delivered by the use of the first current source I is accumulated in the sampling capacitor $C_n$ which is then the only capacitor connected to the other end of the first current source I through the top plate change-over switch $S_{Tn}$.

In case when the end of the next time interval $T_{x+1}$ detected by the control module CM constitutes simultaneously the beginning of the subsequent trigger signal $T_{x+2}$ as it is shown in FIG. 5, electric charge delivered by the use of the first current source I is accumulated in the sampling capacitor $C_n$ which is then the only capacitor connected to the other end of the first current source I through the top plate change-over switch $S_{Tn}$.

In both cases, the control module CM deactivates the signal provided on the complete conversion signal output OutR and assigns the initial value zero to all the bits $b_{n-1}$, $b_{n-2}$, . . . , $b_1$, $b_0$ in the digital word. Then, the control module CM assigns the function of the source capacitor $C_i$ to the additional sampling capacitor $C_{nA}$ by writing the value of the sampling capacitor $C_n$ index to the source index register. Simultaneously, the control module CM assigns the function of the destination capacitor $C_k$ to the capacitor $C_{n-1}$ having the highest capacitance value in the array of redistribution by writing a value of the index of the capacitor $C_{n-1}$ having the highest capacitance value in the array of redistribution to the destination index register. Next, the control module CM by the use of the signal from the output controlling the second current source $A_J$ causes the switching on the second current source J and starts to realize the process of redistribution of charge accumulated in the additional sampling capacitor $C_{nA}$. The process of redistribution is terminated when the capacitor $C_0$ having the lowest capacitance value in the array of redistribution A stops to act as the destination capacitor $C_k$.

After termination of redistribution of charge accumulated previously in the additional sampling capacitor $C_{nA}$ and after assigning the corresponding values to the bits $b_{n-1}$, $b_{n-2}$, . . . , $b_1$, $b_0$ in the digital word, the control module CM activates the complete conversion signal output OutR. By the use of the signal from the output controlling the second current source $A_J$, the control module CM causes the switching off the current source J. Next, the control module CM introduces the apparatus into the relaxation phase shown in FIG. 2.

The method for conversion of a time interval to the digital word, according to the invention, is presented in the second exemplary apparatus as follows.

Figure 8:
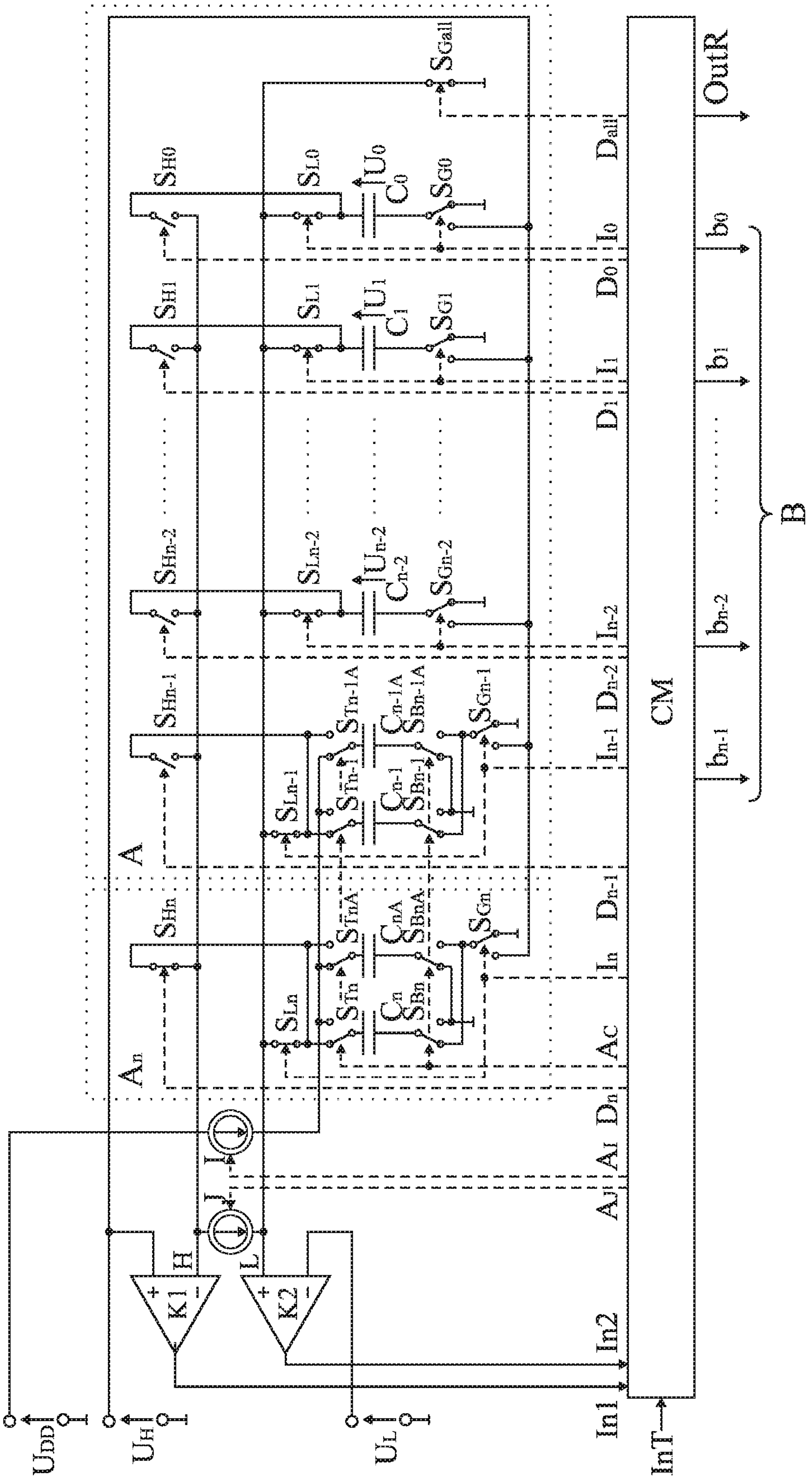
FIG. 8 illustrates the schematic diagram of the apparatus in the phase of relaxation before the beginning of the conversion process.

Before the start of the first process of conversion of a time interval to the digital word having the number of bits equal to n, the control module CM by the use of the signal from the output controlling the change-over switches of plates $A_C$ causes additionally the switching of top plate change-over switches $S_{Tn-1}$, $S_{Tn-1A}$ and switching of the bottom plate change-over switches $S_{Bn-1}$, $S_{Bn-1A}$ and the connection of the top plate of the capacitor $C_{n-1}$ having the highest capacitance value in the array of redistribution to the source on-off switch $S_{Hn-1}$ and to the destination on-off switch $S_{Ln-1}$, the connection of the top plate of the additional capacitor $C_{n-1A}$ having the highest capacitance value in the array of redistribution to the other end of the first current source I, the connection of the bottom plate of the capacitor $C_{n-1}$ having the highest capacitance value in the array of redistribution to the ground change-over switch $S_{Gn-1}$ and the connection of the bottom plate of the additional capacitor $C_{n-1A}$ having the highest capacitance value in the array of redistribution to ground of the circuit. FIG. 8 presents the abovementioned state of the apparatus.

Figure 9:
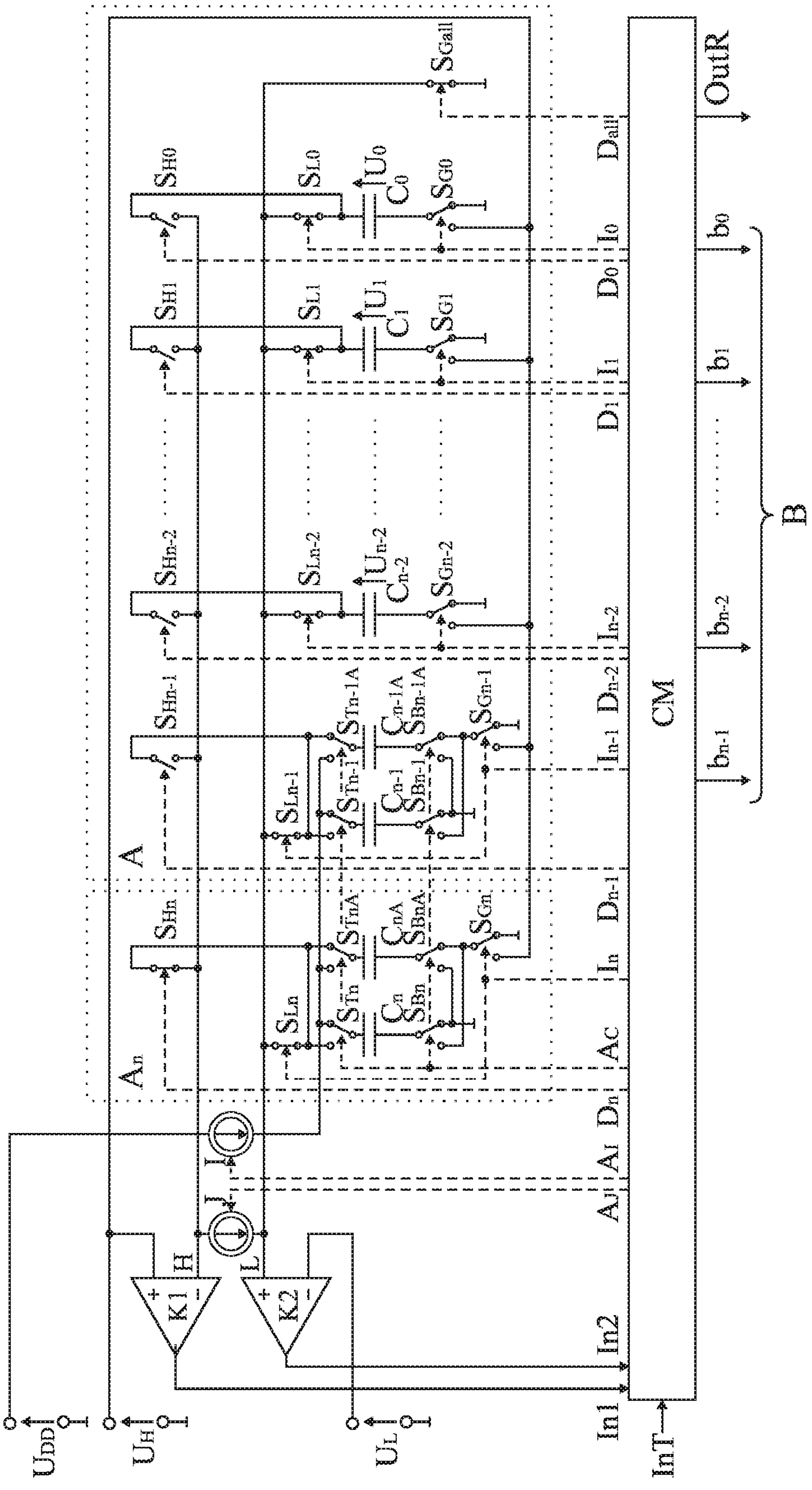
FIG. 9 illustrates the schematic diagram during accumulation of charge in the sampling capacitor $C_n$ and in the capacitor $C_{n-1}$ which is connected to the sampling capacitor $C_n$ in parallel.

As soon as the beginning of the time interval $T_x$ is detected by the control module CM on the time interval signal input InT, the control module CM by the use of the signal from the output controlling the change-over switches of the plates $A_C$ causes additionally the switching of the top plate change-over switches $S_{Tn-1}$, $S_{Tn-1A}$ and switching of the bottom plate change-over switches $S_{B-1n}$, $S_{Bn-1A}$ and the connection of the top plate of the sampling capacitor $C_{n-1}$ having the highest capacitance value in the array of redistribution to the other end of the first current source I, the connection of the top plate of the additional capacitor $C_{n-1A}$ having the highest capacitance value in the array of redistribution to the source on-off switch $S_{Hn-1}$ and to the destination on-off switch $S_{Ln-1}$, the connection of the bottom plate of the sampling capacitor $C_{n-1}$ having the highest capacitance value in the array of redistribution to ground of the circuit and the connection of the bottom plate of the additional capacitor $C_{n-1A}$ having the highest capacitance value in the array of redistribution to the ground change-over switch $S_{Gn-1}$ enforcing a complete discharge of the additional capacitor $C_{n-1A}$ having the highest capacitance value in the array of redistribution. Electric charge delivered by the use of the first current source I is accumulated simultaneously in the sampling capacitor $C_n$ and in the capacitor $C_{n-1}$ having the highest capacitance value in the array of redistribution which is connected to the sampling capacitor $C_n$ in parallel. Both capacitors ($C_n$ and $C_{n-1}$) are the only capacitors that are connected to the other end of the first current source I through the top plate change-over switches $S_{Tn}$, $S_{Tn-1}$. FIG. 9 presents the abovementioned state of the apparatus.

Figure 10:
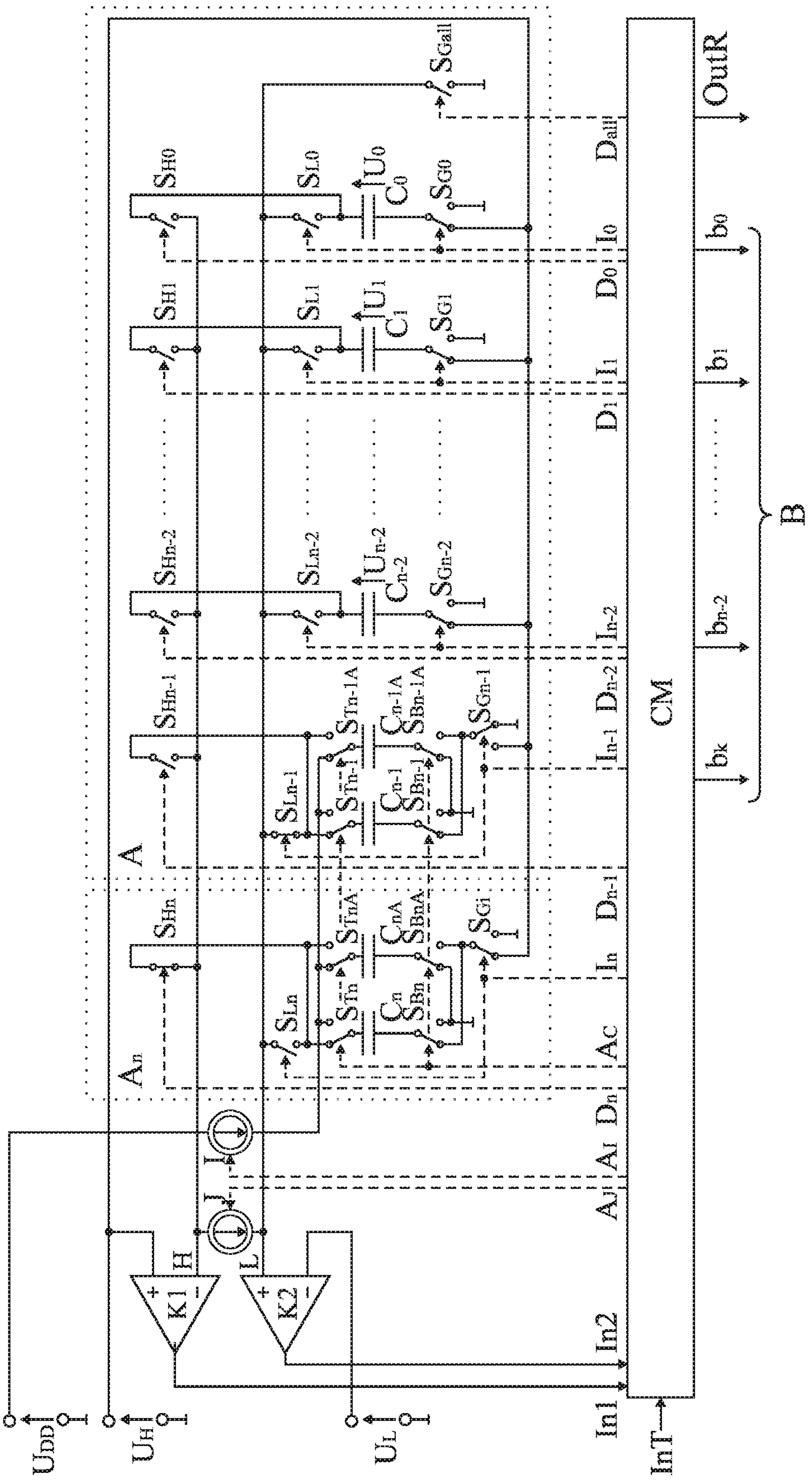
FIG. 10 illustrates the schematic diagram at the beginning of redistribution of charge accumulated in the sampling capacitor $C_n$ and in the capacitor $C_{n-1}$.

After detecting the end of the time interval $T_x$ by the control module CM on the time interval signal input InT, the control module CM by the use of the signal from the output controlling the change-over switches of plates $A_C$ causes additionally switching of the top plate change-over switches $S_{Tn-1}$, $S_{Tn-1A}$ and switching of the bottom plate change-over switches $S_{Bn-1}$, $S_{Bn-1A}$ and the connection of the top plate of the capacitor $C_{n-1}$ having the highest capacitance value in the array of redistribution to the source on-off switch $S_{Hn-1}$ and to the destination on-off switch $S_{Ln-1}$, the connection of the top plate of the additional capacitor $C_{n-1A}$ having the highest capacitance value in the array of redistribution to the other end of the first current source I, the connection of the bottom plate of the capacitor $C_{n-1}$ having the highest capacitance value in the array of redistribution to the ground change-over switch $S_{Gn}$ and the connection of the bottom plate of the additional capacitor $C_{n-1A}$ having the highest capacitance value in the array of redistribution to ground of the circuit. FIG. 10 presents the abovementioned state of the apparatus.

As soon as the beginning of the next time interval $T_{x+1}$ is detected by the control module CM on the time interval signal input InT, the electric charge delivered by the use of the first current source I is accumulated simultaneously in the additional sampling capacitor $C_{nA}$ and in the additional capacitor $C_{n-1A}$ having the highest capacitance value in the array of redistribution which is connected to the additional sampling capacitor $C_{nA}$ in parallel. Both capacitors ($C_{nA}$ and $C_{n-1A}$) are the only capacitors that are connected to the other end of the first current source I through the top plate change-over switches $S_{TnA}$, $S_{Tn-1A}$.

Figure 11:
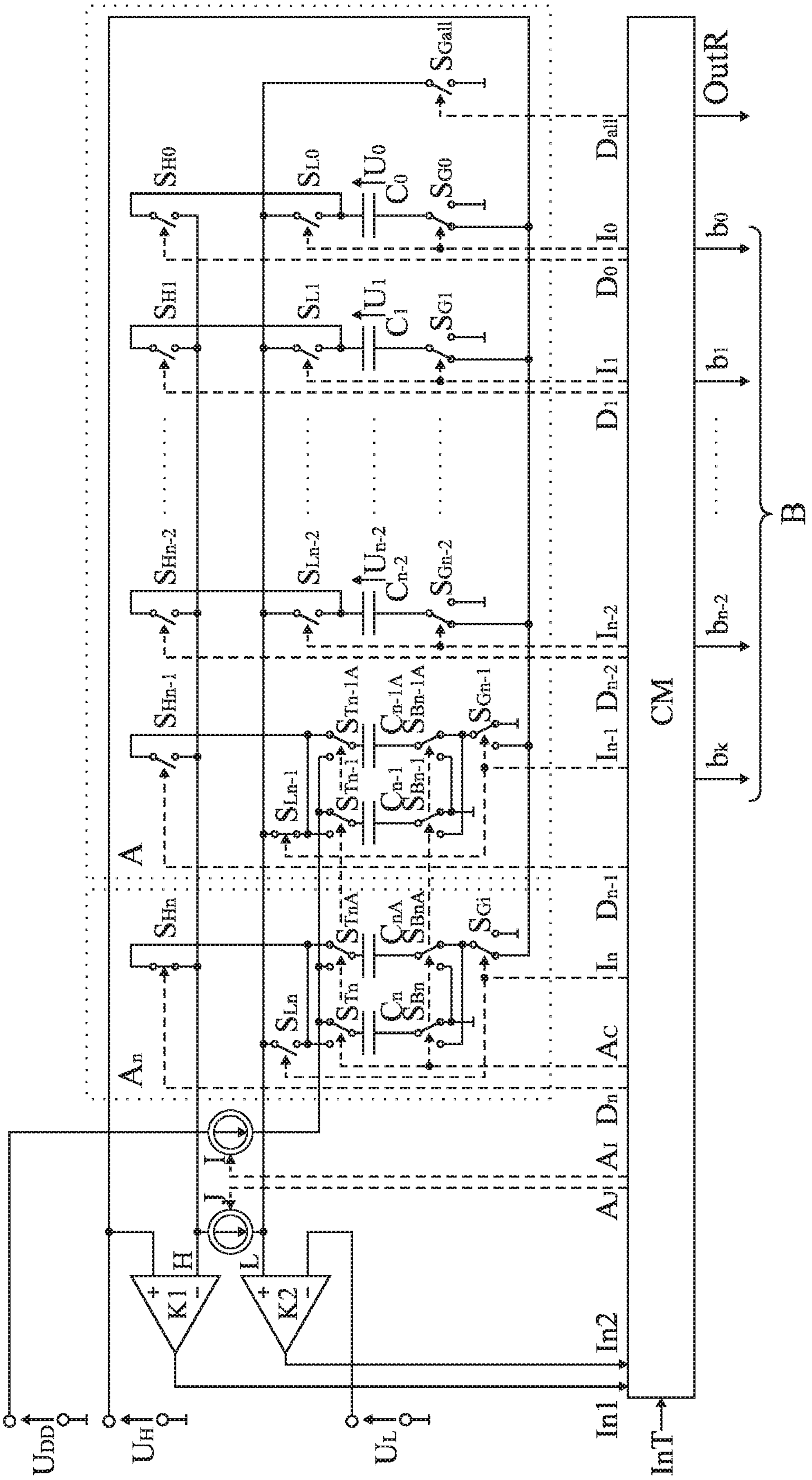
FIG. 11 illustrates the schematic diagram at the beginning of redistribution of charge accumulated in the additional sampling capacitor $C_{nA}$ and in the additional capacitor $C_{n-1A}$.

After detecting the end of the next time interval $T_{x+1}$ by the control module CM on the time interval signal input InT, the control module CM by the use of the signal from the output controlling the change-over switches of the plates $A_C$ causes the switching of the top plate change-over switches $S_{Tn-1}$, $S_{Tn-1A}$ and switching of the bottom plate change-over switches $S_{Bn-1}$, $S_{Bn-1A}$ and the connection of the top plate of the capacitor $C_{n-1}$ having the highest capacitance value in the array of redistribution to the other end of the first current source I, the connection of the top plate of the additional capacitor $C_{n-1A}$ having the highest capacitance value in the array of redistribution to the source on-off switch $S_{Hn-1}$ and to the destination on-off switch $S_{Ln-1}$, the connection of the bottom plate of the capacitor $C_{n-1}$ having the highest capacitance value in the array of redistribution to ground of the circuit and the connection of the bottom plate of the additional capacitor $C_{n-1A}$ to the ground change-over switch $S_{Gn-1}$. FIG. 11 presents the abovementioned state of the apparatus.

Another method for conversion of a time interval to the digital word, according to the invention, realized in the exemplary apparatus differs from the previous methods in that as soon as the process of accumulated electric charge redistribution is terminated, the control module CM causes the electric charge, accumulated in the last of capacitors on which the reference voltage $U_L$ had not been reached during realization of the process of redistribution, to be conserved.

If the control module CM assigns the value zero to the bit $b_0$ during the realization of the process of charge redistribution, the control module CM introducing the apparatus into the relaxation state by the use of the signal from the control output $I_0$ causes the opening of the destination on-off switch $S_{L0}$ and the disconnection of the top plate of the capacitor $C_0$ having the lowest capacitance value in the array of redistribution from the destination rail L, the switching of the ground change-over switch $S_{G0}$ and the connection of the bottom plate of the capacitor $C_0$ having the lowest capacitance value in the array of redistribution to the source of auxiliary voltage $U_H$.

If the control module CM assigns the value one to the bit $b_0$ during the realization of the process of redistribution, the control module CM introducing the apparatus into relaxation state by the use of the signal from the control output $I_i$ causes the opening of the destination on-off switch $S_{Li}$ and the disconnection of the top plate of the source capacitor $C_i$ from the destination rail L, the switching of the ground change-over switch $S_{Gi}$ and the connection of the bottom plate of the source capacitor $C_i$ to the source of auxiliary voltage $U_H$.

METHOD AND APPARATUS FOR CLOCKLESS CONVERSION OF TIME INTERVAL TO DIGITAL WORD

Abbreviations

A array of redistribution
$A_n$ section of sampling capacitor
CM control module
K1 first comparator
K2 second comparator
I first current source
J second current source
$U_H$ source of auxiliary voltage
$U_L$ source of the reference voltage
$U_{DD}$ voltage supply
InT time interval signal input InT
In1 first control input of the control module
In2 second control input of the control module
B digital output of the control module
OutR complete conversion output
H source rail
L destination rail
$C_n$ sampling capacitor
$C_{n-1}, C_{n-2}, \ldots, C_1, C_0$ capacitors in the array of redistribution
$C_{n-1}$ capacitor having the highest capacitance value in the array of redistribution
$C_0$ capacitor having the lowest capacitance value in the array of redistribution
$C_{nA}$ additional sampling capacitor
$C_{n-1A}$ additional capacitor having the highest capacitance value in the array of redistribution
$C_i$ source capacitor
$C_k$ destination capacitor
$U_{n-1}, U_{n-2}, \ldots, U_1, U_0$ voltages on the capacitors in the array of redistribution
$U_i$ voltage on the source capacitor
$U_k$ voltage on the destination capacitor
$b_{n-1}, b_{n-2}, \ldots, b_i, \ldots, b_k, \ldots, b_1, b_0$ bits in the digital word
$S_{Hn}, S_{Hn-1}, S_{Hn-2}, \ldots, S_{Hi}, \ldots, S_{Hk}, \ldots, S_{H1}, S_{H0}$ source on-off switches
$S_{Ln}, S_{Ln-1}, S_{Ln-2}, \ldots, S_{Li}, \ldots, S_{Lk}, \ldots, S_{L1}, S_{L0}$ destination on-off switches $S_{Gn}$, $S_{Gn-1}$, $S_{Gn-2}$, . . . , $S_{Gi}$, . . . , $S_{Gk}$, . . . , $S_{G1}$, $S_{G0}$ ground change-over switches $S_{Tn}$, $S_{Tn-1}$, $S_{TnA}$, $S_{Tn-1A}$ top plate change-over switches $S_{Bn}$, $S_{Bn-1}$, $S_{BnA}$, $S_{Bn-1A}$ bottom plate change-over switches $S_{Gall}$ destination rail on-off switch $A_C$ output controlling change-over switches of the plates $A_I$ output controlling the first current source $A_J$ output controlling the second current source $T_x$ time interval $T_{x+1}$ next time interval $T_{x+2}$ subsequent time interval $I_n$, $I_{n-1}$, $I_{n-2}$, . . . , $I_i$, . . . , $I_k$, . . . , $I_1$, $I_0$ control outputs $D_n$, $D_{n-1}$, $D_{n-2}$, . . . , $D_i$, . . . , $D_k$, . . . , $D_1$, $D_0$, $D_{all}$ control outputs

The invention claimed is:

1. A method for clockless conversion of time interval to digital word consisting in a detection of the beginning and of the end of the time interval by the use of the control module and in mapping this time interval to a portion of electric charge proportional to this time interval and delivered by the use of a current source while the portion of electric charge is accumulated in a sampling capacitor, or in the sampling capacitor and in a capacitor having the highest capacitance value in an array of redistribution, which is connected to the sampling capacitor in parallel, and then consisting in the realization of the process of accumulated electric charge redistribution in the array of redistribution in a known way by means of a control module by changes of states of signals from relevant control outputs, while the array of redistribution comprises an array of on-off switches, of change-over switches and of capacitors such that a capacitance value of each capacitor of a given index is twice as high as a capacitance value of a capacitor of a previous index, and also consisting in the assignment of relevant values to bits of the digital word by means of the control module characterized in that after termination of accumulation of electric charge in the sampling capacitor ($C_n$), or in the sampling capacitor ($C_n$) and in the capacitor ($C_{n-1}$) having the highest capacitance value in the array of redistribution which is connected to the sampling capacitor ($C_n$) in parallel, and after detection of the beginning of the next time interval ($T_{x+1}$) by means of the control module (CM), electric charge is delivered by the use of the current source and accumulated in the additional sampling capacitor ($C_{nA}$), and next the process of redistribution of electric charge accumulated in the additional sampling capacitor ($C_{nA}$) is realized and relevant values are assigned to bits ($b_{n-1}$, $b_{n-2}$, $b_1$, $b_0$) in the digital word by means of the control module (CM) while accumulation of electric charge in the additional sampling capacitor ($C_{nA}$) and the process of redistribution of electric charge accumulated in the additional sampling capacitor ($C_{nA}$) and assignment of relevant values to bits ($b_{n-1}$, $b_{n-2}$, $b_1$, $b_0$) in the digital word are realized such as for the sampling capacitor ($C_n$).

2. The method for conversion as claimed in claim 1 characterized in that after termination of accumulation of electric charge in the additional sampling capacitor ($C_{nA}$) and after detection of the beginning of the subsequent time interval ($T_{x+2}$) by means of the control module (CM), the next cycle begins and electric charge is delivered by the use of the current source and accumulated again in the sampling capacitor ($C_n$), or in the sampling capacitor ($C_n$) and in the capacitor ($C_{n-1}$) having the highest capacitance value in the array of redistribution which is connected to the sampling capacitor ($C_n$) in parallel.

3. The method for conversion as claimed in claim 1 characterized in that in a period of time when electric charge is delivered by the use of the current source and accumulated in the additional sampling capacitor ($C_{nA}$), a part of electric charge is accumulated simultaneously in the additional capacitor ($C_{n-1A}$) having the highest capacitance value in the array of redistribution which is connected to the additional sampling capacitor ($C_{nA}$) in parallel while a capacitance value of the additional capacitor ($C_{n-1A}$) having the highest capacitance value in the array of redistribution equals the capacitance value of the capacitor ($C_{n-1A}$) having the highest capacitance value in the array of redistribution.

4. The method for conversion as claimed in claim 1 characterized in that after termination of process of redistribution, the charge, accumulated in the last of capacitors on which the reference voltage ($U_L$) had not been reached when the process of redistribution was realized, is conserved.

5. An apparatus for clockless conversion of time interval to digital word comprising an array of redistribution whose control inputs are connected to control outputs of a control module and the control module is equipped with a digital output, a complete conversion output, a time interval signal input InT, a first control input connected to an output of a first comparator and a second control input connected to an output of a second comparator whereas a source of auxiliary voltage, a section of the sampling capacitor and a second controlled current source are connected to the array of redistribution while a control input of the second controlled current source is connected to an output controlling the second current source and the one end of the second current source is connected to a source rail and the other end of the second current source is connected to a destination rail and a voltage supply is connected to the one end of the first current source whose control input is connected to an output controlling the first current source whereas the array of redistribution comprises sections whose number equals a number of bits in the digital word, and a section of the sampling capacitor and each section of the array of redistribution comprises a source on-off switch, a destination on-off switch, a ground change-over switch and at least one capacitor whose top plate is connected to the source rail through the source on-off switch and/or to the destination rail through the destination on-off switch and whose bottom plate is connected to ground of the circuit or to the source of auxiliary voltage through the ground change-over switch while a capacitance value of each capacitor of a given index in the array of redistribution is twice as high as a capacitance value of a capacitor of a previous index and also the destination rail is connected to ground of the circuit through the destination on-off switch and to a non-inverting input of a second comparator whose inverting input is connected to the source of a reference voltage and the source rail is connected to an inverting input of a first comparator whose non-inverting input is connected to the source of auxiliary voltage whereas control inputs of the source on-off switches and a control input of the destination rail on-off switch are connected appropriately to the control outputs of the control module and control inputs of the destination on-off switches are coupled together and connected appropriately to the control outputs of the control module characterized in that the other end of the first current source (I) is connected to the section of the sampling capacitor ($A_n$) comprising the additional sampling capacitor ($C_{nA}$), the top plate change-over switches ($S_{Tn}$, $S_{TnA}$), the bottom plate change-over switches ($S_{Bn}$, $S_{BnA}$) while the top plate of the sampling capacitor ($C_n$) and the top plate of the additional sampling capacitor ($C_{n-1}$) are connected to the source on-off switch ($S_{Hn}$) and to the destination on-off switch ($S_{Ln}$) or to the other end of the first current source (I) through the top plate change-over switches ($S_{Tn}$, $S_{TnA}$) whereas the bottom plate of the sampling capacitor ($C_n$) and the bottom plate of the additional sampling capacitor ($C_{nA}$) are connected to the ground change-over switches ($S_{Gn}$) or to ground of the circuit through the bottom plate change-over switches ($S_{Bn}$, $S_{BnA}$) and the control inputs of the top plate change-over switches ($S_{Tn}$, $S_{TnA}$) and the control inputs of the bottom plate change-over switches ($S_{Bn}$, $S_{BnA}$) are coupled together and connected appropriately to the output controlling the change-over switches of the plates ($A_C$).

6. The apparatus for conversion as claimed in claim 5 characterized in that at least one section in the array of redistribution (A) comprises the additional capacitor ($C_{n-1A}$, $C_{n-2A}$, . . . , $C_{1A}$, $C_{0A}$), the top plate change-over switches ($S_{Tn-1}$, $S_{Tn-2}$, . . . , $S_{T1}$, $S_{T0}$; $S_{Tn-1A}$, $S_{Tn-2A}$, . . . , $S_{T1A}$, $S_{T0A}$) and the bottom plate change-over switches ($S_{Bn-1}$, $S_{Bn-2}$, . . . , $S_{B1}$, $S_{B0}$; $S_{Bn-1A}$, $S_{Bn-2A}$, . . . , $S_{B1A}$, $S_{B0A}$) while the top plates of the capacitors ($C_{n-1}$, $C_{n-2}$, . . . , $C_1$, $C_0$) and the top plates of the additional capacitors ($C_{n-1A}$, $C_{n-2A}$, . . . , $C_{1A}$, $C_{0A}$) are connected appropriately to the source on-off switches ($S_{Hn-1}$, $S_{Hn-2}$, . . . , $S_{H1}$, $S_{H0}$) and to the destination on-off switches ($S_{Ln-1}$, $S_{Ln-2}$, . . . , $S_{L1}$, $S_{L0}$) or to the other end of the first current source (I) through the top plate change-over switches ($S_{Tn-1}$, $S_{Tn-2}$, . . . , $S_{T1}$, $S_{T0}$; $S_{Tn-1A}$, $S_{Tn-2A}$, . . . , $S_{T1A}$, $S_{T0A}$) whereas the bottom plates of the capacitors ($C_{n-1}$, $C_{n-2}$, . . . , $C_1$, $C_0$) and the bottom plates of the additional capacitors ($C_{n-1A}$, $C_{n-2A}$, . . . , $C_{1A}$, $C_{0A}$) are connected appropriately to the ground change-over switches ($S_{Gn-1}$, $S_{Gn-2}$, . . . , $S_{G1}$, $S_{G0}$) or to ground of the circuit through the bottom plate change-over switches ($S_{Bn-1}$, $S_{Bn-2}$, . . . , $S_{B1}$, $S_{B0}$; $S_{Bn-1A}$, $S_{Bn-2A}$, . . . , $S_{B1A}$, $S_{B0A}$) whereas the control inputs of the top plate change-over switches ($S_{Tn-1}$, $S_{Tn-2}$, . . . , $S_{T1}$, $S_{T0}$; $S_{Tn-1A}$, $S_{Tn-2A}$, . . . , $S_{T1A}$, $S_{T0A}$) and the control inputs of the bottom plate change-over switches ($S_{Bn-1}$, $S_{Bn-2}$, . . . , $S_{B1}$, $S_{B0}$; $S_{Bn-1A}$, $S_{Bn-2A}$, . . . , $S_{B1A}$, $S_{B0A}$) are coupled together and connected to the output controlling the change-over switches of the plates ($A_C$).

7. The apparatus for conversion as claimed in claim 6 characterized in that the capacitance value of the sampling capacitor ($C_n$) and the capacitance value of the additional sampling capacitor ($C_{nA}$) are not lower than the capacitance value of the capacitor ($C_{n-1}$) having the highest capacitance value in the array of redistribution.

8. The apparatus for conversion as claimed in claim 6 characterized in that the capacitance value of the additional capacitor ($C_{n-1A}$, $C_{n-2A}$, . . . , $C_{1A}$, $C_{0A}$) in the array of redistribution is equal appropriately to the capacitance value of the capacitor ($C_{n-1}$, $C_{n-2}$, . . . , $C_1$, $C_0$) in the array of redistribution.

* * * * *